(12) United States Patent
Salcido et al.

(10) Patent No.: US 7,570,083 B2
(45) Date of Patent: Aug. 4, 2009

(54) HIGH-SPEED RECEIVER ASSEMBLY

(75) Inventors: Manuel Salcido, Fort Collins, CO (US); Michelle Marie Gentry, Wellington, CO (US); Ryan Korzyniowski, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 119 days.

(21) Appl. No.: 11/741,138

(22) Filed: Apr. 27, 2007

(65) Prior Publication Data

US 2008/0265986 A1 Oct. 30, 2008

(51) Int. Cl.
*H03K 5/22* (2006.01)

(52) U.S. Cl. .............................. 327/77; 327/88; 327/89; 327/53; 327/56

(58) Field of Classification Search ........................ None
See application file for complete search history.

(56) References Cited

U.S. PATENT DOCUMENTS 6,259,280 B1 * 7/2001 Koelling ..................... 327/53
6,970,022 B1 * 11/2005 Miller ......................... 327/77
2006/0066359 A1 * 3/2006 Tso et al. ..................... 327/77
2006/0214700 A1 * 9/2006 Nairn .......................... 327/77

* cited by examiner

*Primary Examiner*—Tuan Lam

(57) ABSTRACT

A high-speed receiver suitable for applications that desire a common-mode voltage range from approximately 0.7V to approximately 0.9V is arranged by coupling first and second differential pair circuit architectures based on first and second current-steering schemes into the same path to generate an output signal. The high-speed receiver includes first and second differential pair circuits. The first differential pair circuit is coupled to a first current-steering path via a first port and a second current-steering path via a second port. The second differential pair circuit is coupled to the first current-steering path via a third port and the second current-steering path via a fourth port. A bridge circuit is interposed between the first and second differential pair circuits. The bridge circuit integrates the first and second current-steering paths in a single-stage of the high-speed receiver assembly.

17 Claims, 5 Drawing Sheets

HIGH-SPEED RECEIVER ASSEMBLY

BACKGROUND

The use of small geometry and low-voltage semiconductor devices (i.e., semiconductor devices that reliably operate when the voltage across any two transistor terminals is less than a relatively low maximum voltage) is the trend in advanced integrated circuits (ICs). These low-voltage devices consume less power and can be reliably operated at higher clock rates than larger geometry semiconductor devices that tolerate relatively higher terminal-to-terminal voltage differences. Accordingly, low-voltage devices are used in a number of electronic systems. Intermediate voltage-level devices (i.e., devices that reliably operate when the voltage across any two transistor terminals is less than approximately 3V) are generally used in ICs that require analog functions. Even higher voltage levels are required by some circuits used in both analog and digital functional blocks related to system interfaces and other functions. One way to accommodate these higher voltages is to use transistors designed to operate reliably at corresponding higher voltage levels. For example, transistors where the voltage across any two transistor device terminals can be 5V without reliability issues (i.e., 5V transistors) can be used to manage inter-IC power (e.g., on/off) functions over a range of voltages from 0V to about 5V.

As input/output power supply voltages are reduced, it becomes increasingly difficult to meet performance requirements for high-speed low-voltage applications using complimentary metal-oxide semiconductor (CMOS) devices using a field-effect transistor (FET) designed to tolerate higher terminal-to-terminal voltages.

Therefore, it would be desirable to provide a low cost, reliable and integrated receiver solution that can be implemented using existing semiconductor manufacturing process technologies.

SUMMARY

One embodiment of a high-speed receiver assembly comprises first and second differential pair circuits using first and second sets of semiconductor devices, respectively. Each of the first and second differential pair circuits are coupled at opposing ends of respective first and second current-steering paths. The high-speed receiver assembly generates an output signal by introducing a bridge circuit that couples the first and second current-steering paths within a present stage of the high-speed receiver assembly.

One embodiment of a method for implementing a high-speed receiver using semiconductor devices optimized at a higher-voltage level than a desired operating range of the high-speed receiver includes the steps of providing a first differential pair circuit using a first set of semiconductor devices to produce a first port and a second ports, the first and second ports coupled to respective first and second current-steering paths, providing a second differential pair circuit using a second set of semiconductor devices to produce a third port and a fourth port, the third and fourth ports coupled to opposing ends of the first and second current-steering paths and inserting a bridge circuit configured to couple the first differential pair circuit to the second differential pair circuit via the first and second current-steering paths in a present stage of the high-speed receiver.

The figures and detailed description that follow are not exhaustive. The disclosed embodiments are illustrated and described to enable one of ordinary skill to make and use the high-speed receiver. Other embodiments, features and advantages of the high-speed receiver assembly and method for implementing the same using semiconductor devices optimized at a higher-voltage level than a desired operating range of the high-speed receiver assembly will be or will become apparent to those skilled in the art upon examination of the following figures and detailed description. All such additional embodiments, features and advantages are within the scope of the assemblies, circuits and methods as defined in the accompanying claims.

BRIEF DESCRIPTION OF THE FIGURES

The high-speed receiver assembly and methods for manufacturing a high-speed receiver can be better understood with reference to the following figures. The components within the figures are not necessarily to scale, emphasis instead being placed upon clearly illustrating the principles of the high-speed receiver. Moreover, in the figures, like reference numerals designate corresponding parts throughout the different views.

DETAILED DESCRIPTION

The high-speed receiver assembly or high-speed receiver can be implemented in a myriad of systems and applications where it is desirable to provide accurate and reliable high-speed input buffers (i.e., receivers) using higher-voltage FETs operating at lower-voltages. In one embodiment, the high-speed receiver uses 3.3V FETs to operate at approximately 1.5V.

The high-speed receiver can include any or a combination of the following technologies, which are all well known in the art: discrete electronic components, an integrated circuit, an application-specific integrated circuit having appropriately configured semiconductor devices and other circuit elements (e.g., discrete resistors or semiconductor devices arranged to simulate a resistor). The high-speed receiver is accurate and reliable over a range of voltages.

In some embodiments, the high-speed receiver is implemented with a combination of low-voltage semiconductor devices and higher voltage semiconductor devices.

In one embodiment, the high-speed receiver is suitable for applications that desire a common-mode voltage from approximately 0.7V to approximately 0.9V. The high-speed receiver is arranged by coupling first and second differential pair circuit architectures based on first and second current-steering schemes into the same path to generate an output signal. The high-speed receiver includes first and second differential pair circuits. The first differential pair circuit is coupled to a first current-steering path via a first port and a second current-steering path via a second port. The second differential pair circuit is coupled to the first current-steering path via a third port and the second current-steering path via a fourth port. A bridge circuit is interposed between the first and second differential pair circuits. The bridge circuit integrates the first and second current-steering paths in a single-stage of the high-speed receiver assembly.

Figure 1:
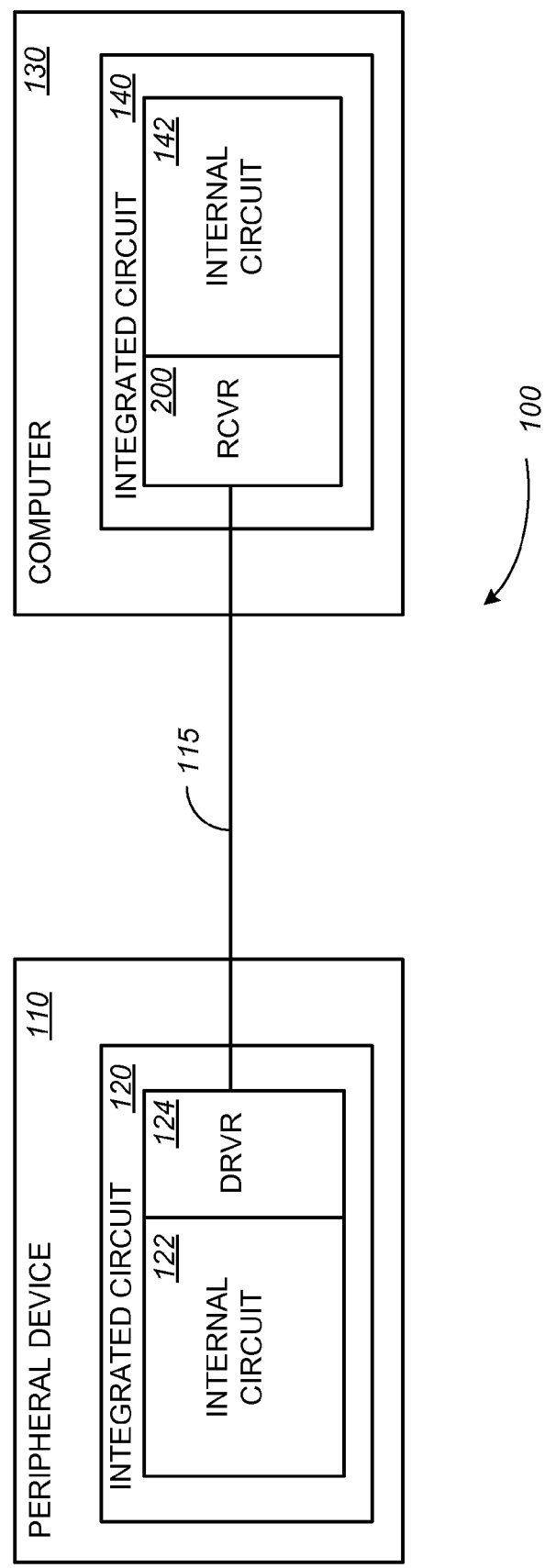
FIG. 1 is a block diagram of an embodiment of a pair of communicatively coupled systems.

Turning now to the drawings, wherein like reference numerals designate corresponding parts throughout the drawings, reference is made to FIG. 1, which illustrates a block diagram of an embodiment of a pair of communicatively coupled devices. System 100 includes a peripheral device 110 connected to a computer 130 via a connection 115. Both peripheral device 110 and computer 130 contain respective integrated circuits. Integrated circuit 120 within peripheral device 110 is coupled to integrated circuit 140 within computer 130 via internal circuit 122, signal driver 124, wired connection 115, high-speed receiver assembly, labeled "RCVR" 200 and internal circuit 142. For simplicity of illustration and description, system 100 depicts a transfer of information via a data signal that propagates from its origin within internal circuit 122 to its destination in internal circuit 142. To traverse the gap bridged by connection 115, the data signal is controllably conditioned and transmitted by driver 124. High-speed receiver assembly 200 receives the transmitted data and controllably conditions the received data before forwarding the signal to internal circuit 142.

In the illustrated embodiment, system 100 includes dissimilar devices (i.e., peripheral device 110 and computer 130). System 100 is not limited to this combination and may include similarly configured devices. For example, various circuits or functional blocks within very large scale integrated circuits will often be coupled to each other to communicate one or more control or data signals. When these signals traverse a relatively large gap between a sending circuit block and a receiving circuit block, these input/output circuits will often use an output buffer or driver to transmit the intended signal and an input buffer or receiver to collect and reproduce the received signal.

Although connection 115 is illustrated in FIG. 1 as a single link connecting peripheral device 110 to computer 130, and more particularly internal circuit 122 with internal circuit 142 via driver 124 and receiver 200, it will be appreciated that connection 115 can be a multiple conductor connection such as those configured to support operation of a data transfer mechanism such as a serial data bus or a parallel data bus.

Figure 2:
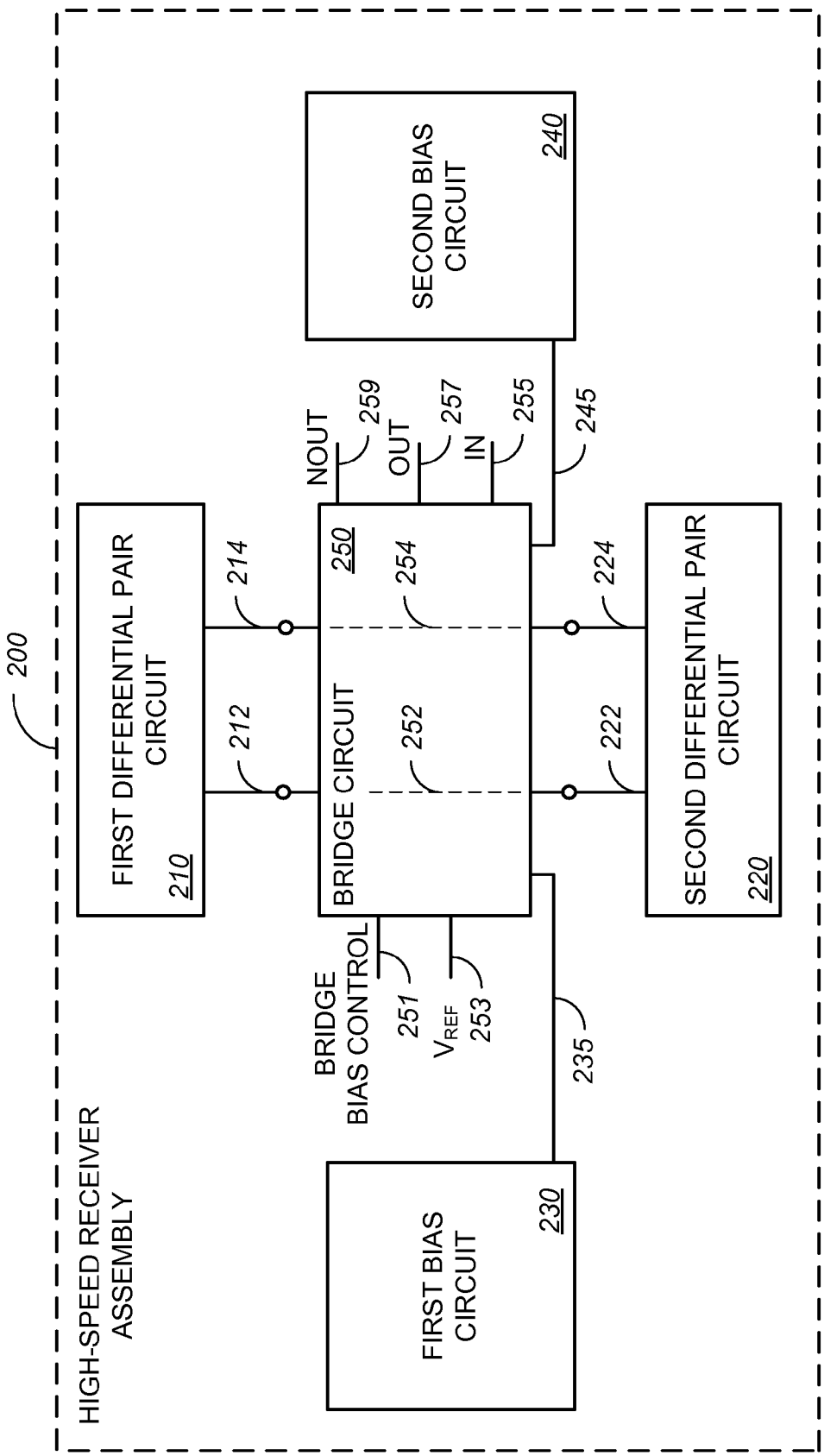
FIG. 2 is a functional block diagram illustrating an embodiment of the high-speed receiver assembly of FIG. 1.

FIG. 2 is a functional block diagram illustrating an embodiment of the high-speed receiver assembly 200 of FIG. 1. As illustrated in FIG. 2, high-speed receiver assembly 200 includes first differential pair circuit 210 and second differential pair circuit 220 with bridge circuit 250 interposed between first differential pair circuit 210 and second differential pair circuit 220. First differential pair circuit 210 forms first port 212, which is connected to first current-steering path 252 through bridge circuit 250 and port 214, which is connected to second current-steering path 254 through bridge circuit 250. Second differential pair circuit 220 forms third port 222, which is connected to first current-steering path at an opposing end of first port 252. Second differential pair circuit 220 also forms fourth port 224, which is connected to second current-steering path 254 at an opposing end of second port 214.

In addition to the first and second bias signals, bridge circuit 250 further receives a bridge bias control via connection 251, a reference voltage, Vref, via connection 253, and an input signal via connection 255. Although, the illustrated embodiment depicts the reference voltage and input signal as being supplied to bridge circuit 250 via single connections, it should be understood that connection 253 and connection 255 are differential input signals. As also illustrated in FIG. 2, bridge circuit 250 receives a first bias signal from first bias circuit 230 via connection 235 and a second bias signal from second bias circuit 240 via connection 245. As will be explained further below, the bridge circuit combines the first and second current-steering paths of the high-speed receiver assembly under the control of the first bias signal, the second bias signal and the bridge bias control signal to generate first and second differential output signals, labeled "OUT" and "NOUT," along connection 257 and connection 259, respectively. The first and second differential output signals closely track the input signal across a range of temperatures and circuit conditions introduced by semiconductor device manufacturing process variation.

Figure 3:
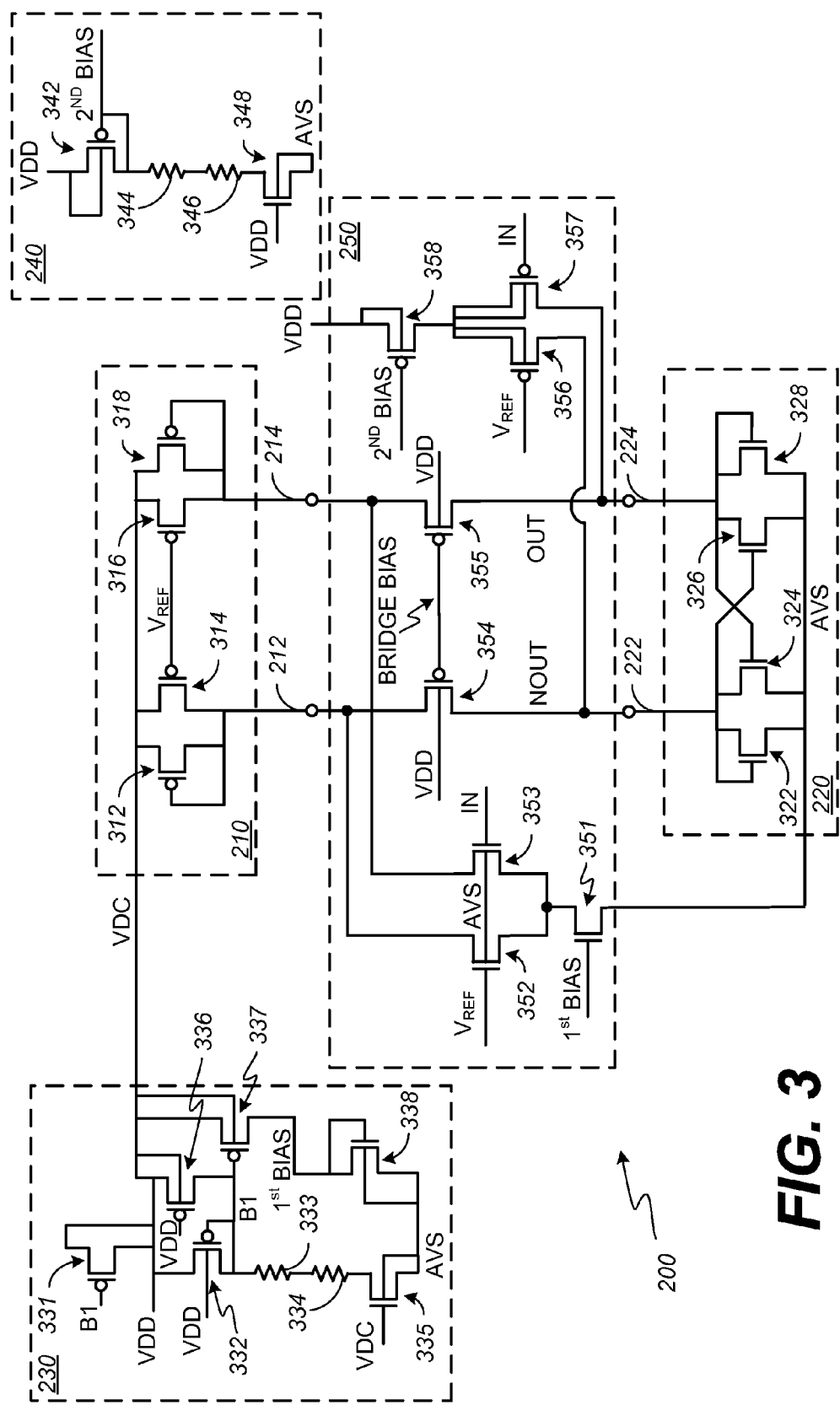
FIG. 3 is a schematic diagram illustrating an alternative embodiment of the high-speed receiver assembly of FIG. 1.

FIG. 3 is a circuit schematic illustrating an alternative embodiment of the high-speed receiver 200 of FIG. 1. As illustrated in FIG. 3, high-speed receiver assembly 200 includes first differential pair circuit 210 and second differential pair circuit 220 with bridge circuit 250 interposed between first differential pair circuit 210 and second differential pair circuit 220. First differential pair circuit 210 receives an input voltage, labeled VDC, from first bias circuit 230, a second input voltage, labeled Vref and as described above forms first port 212 and second port 214. First differential pair circuit 210 includes a first set of semiconductor devices. In the illustrated embodiment, the first set of semiconductor devices includes a network of PFETs. The network of PFETs is arranged as follows. Each of the source terminals of PFET 312, PFET 314, PFET 316 and PFET 318 are coupled to input VDC. The drain terminals of PFET 312 and PFET 314 are coupled to each other and to the gate terminal of PFET 312. The drain terminals of PFET 312 and PFET 314 and the gate terminal of PFET 312 are coupled to port 212. The gate terminals of PFET 314 and PFET 316 are coupled to each other and receive the second input voltage (Vref). The drain terminals of PFET 316 and PFET 318 are coupled to each other and to the gate terminal of PFET 318. The drain terminals of PFET 316 and PFET 318 and the gate terminal of PFET 318 are coupled to port 214.

Second differential pair circuit 220 receives an input voltage, labeled AVS, from first bias circuit 230 and as described above forms third port 222 and fourth port 224. Second differential pair circuit 220 includes a second set of semiconductor devices. In the illustrated embodiment, the second set of semiconductor devices includes a network of NFETs. The network of NFETs is arranged as follows. Each of the drain terminals of NFET 322, NFET 324, NFET 326 and NFET 328 are coupled to each other and to input AVS. The source terminals of NFET 322 and NFET 324 as well as the gate terminals of NFET 326 and NFET 322 are coupled to each other and third port 222. The source terminals of NFET 326 and NFET 328 as well as the gate terminals of NFET 324 and NFET 328 are coupled to each other and fourth port 224.

First bias circuit 230 receives an input voltage, labeled VDD. In response to the VDD input, first bias circuit 230 generates three outputs. A first output, labeled VDC, is applied at an input of the first differential pair circuit 210 as described above. A second output, labeled AVS, is coupled to the second differential pair circuit 220 as also described above. A third output, labeled $1^{st}$ BIAS, will be applied to an input of bridge circuit 250 to controllably couple the first differential pair circuit 210 to the first and second current-steering paths of bridge circuit 250. In the illustrated embodiment, first bias circuit includes a network of semiconductor devices and a pair of resistive elements coupled in series. The network of semiconductor devices includes both PFETs and NFETs.

First bias circuit 230 is arranged as follows. Input voltage, VDD, is coupled to the source terminals of PFET 331, PFET 332, PFET 336 and PFET 337. Input voltage, VDD, is also coupled to the drain of PFET 331 and to the gate of PFET 336. The gate terminals of PFET 331, PFET 332 and PFET 337 are coupled to each other along with the drain terminals of PFET 332 and PFET 336. The node formed by the gate terminals of PFET 331, PFET 332 and PFET 337 and the drain terminals of PFET 332 and PFET 336 is labeled B1. The series combination of resistive element 333 and resistive element 334 is interposed between node B1 and the source of NFET 335. The gate of NFET 335 receives voltage VDC, which as described above is also coupled to first differential pair circuit 210. The drain of PFET 337 and the source of NFET 338 form a node, labeled $1^{st}$ BIAS. As described above, the voltage at $1^{st}$ BIAS is provided at a corresponding input to bridge circuit 250. Second output, AVS, is coupled to the drain terminals of NFET 335 and NFET 338.

Second bias circuit 240 receives an input voltage, labeled VDD. In response to the VDD input, second bias circuit 240 generates two outputs. A first output, labeled AVS, is coupled to the second differential pair circuit 220 and first bias circuit 230 as described above. A second output, labeled $2^{nd}$ BIAS, will be applied to an input of bridge circuit 250 to controllably couple the second differential pair circuit 220 to the first and second current-steering paths of bridge circuit 250. In the illustrated embodiment, second bias circuit includes a network of semiconductor devices and a pair of resistive elements coupled in series. The network of semiconductor devices includes both a PFET and a NFET.

Second bias circuit 240 is arranged as follows. Input voltage, VDD, is coupled to the source terminal of PFET 342 and the gate terminal of NFET 348. The gate terminal and drain terminal of PFET 342 are coupled to each other forming a node, labeled $2^{nd}$ BIAS, which as described above is applied to bridge circuit 250. A series combination of resistive element 344 and resistive element 346 is interposed between node $2^{nd}$ BIAS and the source of NFET 348. As described above, first output, AVS, is coupled to the drain terminal of NFET 348.

Bridge circuit 250 is interposed between first differential pair circuit 210 and second differential pair circuit 220. Specifically, bridge circuit 250 is coupled to first differential pair circuit 210 via first port 212 and second port 214. Bridge circuit 250 is coupled to second differential pair circuit 220 via third port 222 and fourth port 224. Circuit elements interposed between first port 212 and third port 222 form a first current-steering path through bridge circuit 250. Similarly, circuit elements interposed between second port 214 and fourth port 224 form a second current-steering path through bridge circuit 250. In contrast with known analog receiver designs, bridge circuit 250 combines the multiple ports without the application of additional receiver stages.

As described above, bridge circuit 250 receives the first and second bias signals ($1^{st}$ BIAS and $2^{nd}$ BIAS) from first bias circuit 230 and second bias circuit 240, respectively. As further described above, bridge circuit 250 receives a bridge bias control voltage. Bridge circuit 250 also receives Vref and an input signal at multiple locations. As shown in FIG. 3, bridge circuit 250 is also arranged to receive VDD and AVS input voltages at multiple locations.

Bridge circuit 250 includes a network of semiconductor devices. The network of semiconductor devices includes PFETs and NFETs. A first current-steering path includes PFET 354. The source terminal of PFET 354 is coupled to first port 212. The gate of PFET 354 is coupled to the bridge bias control input node. The drain terminal of PFET 354 is coupled to third port 222. A second current-steering path includes PFET 355. The source terminal of PFET 355 is coupled to second port 214. The gate of PFET 355 is coupled to the bridge bias control input node and the gate of PFET 354. The drain terminal of PFET 355 is coupled to fourth port 224.

A first current-steering control couples the $1^{st}$ BIAS, Vref and IN voltages to first port 212 and second port 214. This first current-steering control includes NFET 351, NFET 352 and NFET 353. The source terminals of NFET 352 and NFET 353 are coupled to first port 212 and second port 214, respectively. Input Vref is coupled to the gate terminal of NFET 352. Input voltage IN is coupled to the gate terminal of NFET 353. The drain terminals of NFET 352 and NFET 353 are coupled to each other and the source terminal of NFET 351. $1^{st}$ BIAS input is coupled to the gate of NFET 351. The drain of NFET 351 is coupled to input AVS.

A second current-steering control couples the $2^{nd}$ BIAS, Vref and IN voltages to third port 222 and fourth port 224. This second current-steering control includes PFET 356, PFET 357 and PFET 358. The drain terminals of PFET 356 and PFET 357 are coupled to third port 222 and fourth port 224, respectively. Input Vref is coupled to the gate terminal of PFET 356. Input voltage IN is coupled to the gate terminal of PFET 357. The source terminals of PFET 356 and PFET 357 are coupled to each other and the drain terminal of PFET 358. The $2^{nd}$ BIAS input is coupled to the gate of PFET 358. The source of PFET 358 is coupled to input VDD.

The high-speed receiver assembly 200 is arranged by combining low-voltage optimized PFETs and NFETs with higher-voltage optimized PFETs and NFETs. FETs exposed to external circuits are of the latter type (i.e., FETs optimized for operation at higher-voltages). All remaining FETs or those FETs that are not exposed to external circuits are core FETs or FETs optimized for operation at low-voltage. As indicated above, in one embodiment, the higher voltage FETs are optimized for operation at approximately 3.3V and the low-voltage FETs are optimized for operation at approximately 1.5V.

In operation, bridge circuit 250 controllably combines the first and second current-steering paths of the high-speed receiver assembly under the control of the first bias signal, the second bias signal and the bridge bias control signal to generate first and second differential output signals, labeled "OUT" and "NOUT." The first and second differential output signals closely track the input signal across a range of temperatures and circuit conditions introduced by semiconductor device manufacturing process variation. This is accomplished by applying a bridge bias control signal that directs the application of the first and second steering paths over a range of conditions that result from semiconductor device manufacturing process variation and changes in temperature.

Figure 4:
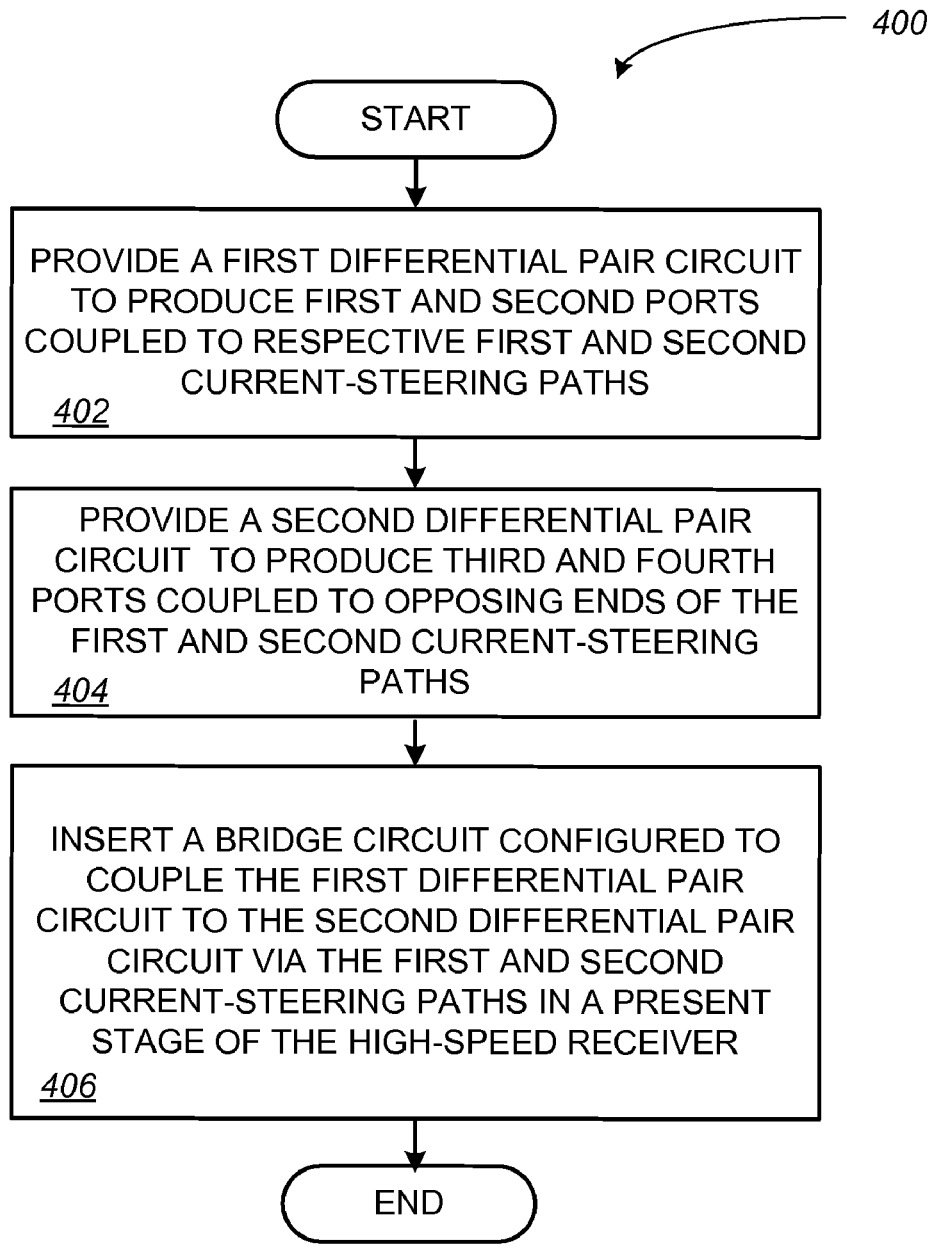
FIG. 4 is a flow chart illustrating an embodiment of a method for implementing a high-speed receiver.

FIG. 4 is a flow chart illustrating an embodiment of a method 400 for implementing a high-speed receiver. Method 400 begins with block 402 where a first differential pair circuit is provided to produce first and second ports that are coupled to respective first and second current-steering paths. In block 404, a second differential pair circuit is provided to produce third and fourth ports that are coupled to opposing ends of the first and second current-steering paths. Thereafter, as indicated in block 406, a bridge circuit is inserted between the first differential pair circuit and the second differential pair circuit to couple the differential pair circuits via the first and second current-steering paths in a present stage of the high-speed receiver.

Figure 5:
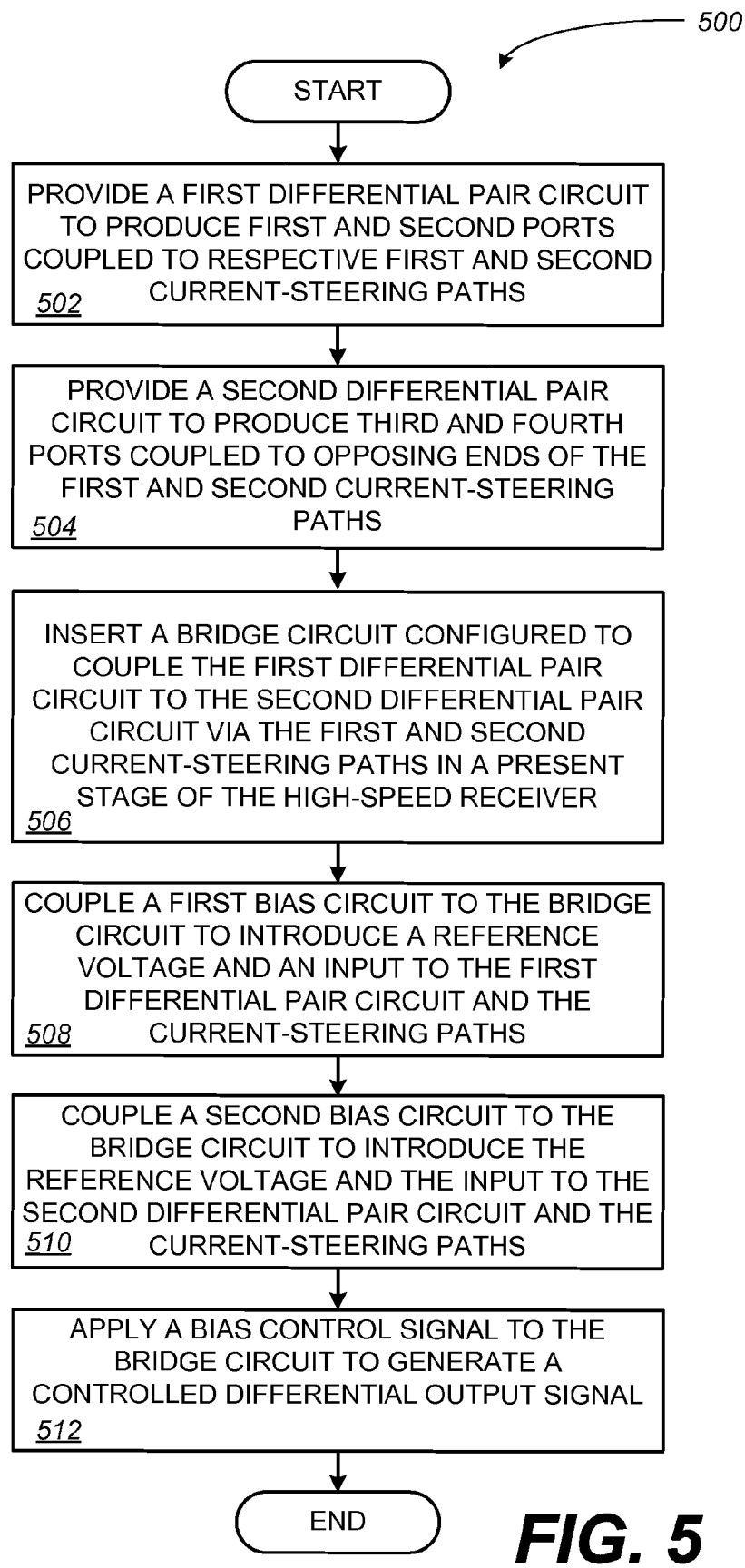
FIG. 5 is a flow chart illustrating an alternative embodiment of a method for implementing a high-speed receiver.

FIG. 5 is a flow chart illustrating an alternative embodiment of a method 500 for implementing a high-speed receiver. Method 500 begins with block 502 where a first differential pair circuit is provided to produce first and second ports that are coupled to respective first and second current-steering paths. In block 504, a second differential pair circuit is provided to produce third and fourth ports that are coupled to opposing ends of the first and second current-steering paths. Thereafter, as indicated in block 506, a bridge circuit is inserted between the first differential pair circuit and the second differential pair circuit to couple the differential pair circuits via the first and second current-steering paths in a present stage of the high-speed receiver. As indicated in block 508, a first bias circuit is coupled to the bridge circuit to introduce a reference voltage and an input to the first differential pair circuit and the current-steering paths. In block 510, a second bias circuit is coupled to the bridge circuit to introduce the reference voltage and the input to the second differential pair circuit and the current-steering paths. Thereafter, in block 512, a bias control signal is applied to the bridge circuit to generate a controlled differential output signal.

While various embodiments of the high-speed receiver assembly and methods for implementing or manufacturing the same have been described, it will be apparent to those of ordinary skill in the art that many more embodiments and implementations are possible that are within the scope of this disclosure. Accordingly, the high-speed receiver assembly is not to be restricted or otherwise limited except in light of the attached claims and their equivalents.

What is claimed is:

1. A method for implementing a high-speed receiver using semiconductor devices optimized at a higher-voltage level than a desired operating range of the high-speed receiver, the method comprising:
providing a first differential pair circuit using a first set of semiconductor devices to produce a first port and a second port, the first and second ports coupled to respective first and second current-steering paths;
providing a second differential pair circuit using a second set of semiconductor devices to produce a third port and a fourth port, the third and fourth ports coupled to opposing ends of the first and second current-steering paths;
inserting a bridge circuit configured to couple the first differential pair circuit to the second differential pair circuit via the first and second current-steering paths in a present stage of the high-speed receiver; and
coupling a first bias circuit to the bridge circuit, the first bias circuit configured to controllably couple a reference voltage and an input signal to the first differential pair circuit and the first and second current-steering paths, the first bias circuit generating a first bias circuit output, a second bias circuit output and a third bias circuit output that are applied at an input of the first differential pair circuit, at an input to the second differential pair circuit and at an input of the bridge circuit, respectively.

2. The method of claim 1, wherein providing a first differential pair circuit using a first set of semiconductor devices comprises using positive channel field-effect transistors (PFETs).

3. The method of claim 1, wherein providing the second differential pair circuit using a second set of semiconductor devices comprises using negative channel field-effect transistors (NFETs).

4. The method of claim 1, further comprising:
coupling a second bias circuit to the bridge circuit, the second bias circuit configured to controllably couple the reference voltage and the input signal to the second differential pair circuit and the first and second current-steering paths, the second bias circuit generating a first output of the second bias circuit and a second output of the second bias circuit that are applied at a second bias input of the bridge circuit and at an input of the second differential pair circuit, respectively.

5. The method of claim 4, wherein the first and second bias circuits control the operation of the bridge circuit in the coupling of the first and second current-steering paths to generate a differential output signal.

6. The method of claim 5, further comprising controlling the coupling over a range of conditions that result from semiconductor device manufacturing process variation.

7. The method of claim 5, further comprising controlling the coupling over a range of temperatures.

8. The method of claim 1, wherein the providing and the coupling are accomplished using a single integrated circuit substrate.

9. A high-speed receiver assembly, comprising:
a first differential pair circuit coupled to a first current-steering path and a second current-steering path via a first port and a second port, respectively;
a second differential pair circuit coupled to the first current-steering path and the second current-steering path via a third port and a fourth port, respectively;
a bridge circuit interposed between the first differential pair circuit and the second differential pair circuit along the first and second current-steering paths, the bridge circuit configured to integrate the first and second current-steering paths in a single-stage of the high-speed receiver assembly, the bridge circuit arranged to receive a first bias signal from a first bias circuit, a second bias signal from a second bias circuit and an input voltage generated by both of the first and second bias circuits.

10. The high-speed receiver assembly of claim 9, wherein the bridge circuit is responsive to a reference voltage signal and a receiver input signal.

11. The high-speed receiver assembly of claim 9, wherein the bridge circuit is arranged to produce a differential output responsive to a bias control signal.

12. The high-speed receiver assembly of claim 11, wherein the bias control signal directs the bridge circuit over a range of temperatures.

13. The high-speed receiver assembly of claim 11, wherein the bias control signal directs the bridge circuit over a range of conditions that result from semiconductor device manufacturing process variation.

14. The high-speed receiver assembly of claim 9, wherein the first differential pair circuit comprises a first set of positive channel field-effect transistors (PFETs).

15. The high-speed receiver assembly of claim 9, wherein the second differential pair circuit comprises a second set of negative channel field-effect transistors (NFETs).

16. The high-speed receiver assembly of claim 14, wherein the first differential pair circuit is arranged to receive first and second input signals.

17. The high-speed receiver assembly of claim 15, wherein the second differential pair circuit is arranged to receive the input voltage generated by both of the first and second bias circuits.

* * * * *

UNITED STATES PATENT AND TRADEMARK OFFICE
CERTIFICATE OF CORRECTION

| | | |
|---|---|---|
| PATENT NO. | : 7,570,083 B2 | Page 1 of 1 |
| APPLICATION NO. | : 11/741138 | |
| DATED | : August 4, 2009 | |
| INVENTOR(S) | : Manuel Salcido et al. | |

It is certified that error appears in the above-identified patent and that said Letters Patent is hereby corrected as shown below:

Column 8, Line 26, Claim 9, after "respectively;" insert --and--.

Signed and Sealed this
Twenty-fifth Day of September, 2012

David J. Kappos
*Director of the United States Patent and Trademark Office*